(12) United States Patent
Koitsalu

(10) Patent No.: US 6,522,901 B1
(45) Date of Patent: Feb. 18, 2003

(54) PORTABLE RADIO TRANSCEIVER

(75) Inventor: Evald Koitsalu, Huddinge (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/526,312

(22) Filed: Mar. 16, 2000

(30) Foreign Application Priority Data

Mar. 16, 1999 (SE) .............................................. 9900951

(51) Int. Cl.[7] .............................. H04B 1/38; H04M 1/00
(52) U.S. Cl. .......................... 455/572; 455/127; 455/73
(58) Field of Search .......................... 455/127, 73, 522, 455/572; 330/278, 277, 296

(56) References Cited

U.S. PATENT DOCUMENTS

| | | | |
|---|---|---|---|
| 4,439,743 A | * 3/1984 | Schwarz et al. | 330/267 |
| 4,533,988 A | * 8/1985 | Daly et al. | 128/903 |
| 4,897,612 A | * 1/1990 | Carroll | 330/277 |
| 4,996,499 A | * 2/1991 | Zarabadi et al. | 330/264 |
| 5,329,578 A | * 7/1994 | Brennan et al. | 379/196 |
| 5,335,263 A | 8/1994 | Tsunehiro et al. | |
| 5,465,400 A | 11/1995 | Norimatsu | |
| 5,859,568 A | * 1/1999 | Le et al. | 330/289 |
| 6,049,704 A | * 4/2000 | Peckham et al. | 330/279 |
| 6,377,124 B1 | * 4/2002 | Brandt | 330/277 |

FOREIGN PATENT DOCUMENTS

EP 0 700 165 A2 3/1996 .................. 455/572

* cited by examiner

Primary Examiner—Nguyen T. Vo
Assistant Examiner—Kamran Afshar
(74) Attorney, Agent, or Firm—Nixon & Vanderhye, P.C.

(57) ABSTRACT

A portable radio transceiver has a transmitter power amplifier (PA) and a series transistor (V1), which is connected to the transmitter power amplifier and is adapted, in response to a transmission control signal (TX on/off), to control transmission by the transmitter power amplifier. Negative bias generating means provides negative bias ($V_{neg}$) to the transmitter power amplifier and is also used for increasing a voltage applied to the gate of the series transistor so as to reduce its resistance. The negative bias generating means has a second transistor (V2) connected to the gate of the series transistor (V1), and a third transistor (V3), the gate of which is adapted to receive the transmission control signal (TX on/off) It also has a capacitor (C1) connected between the second and third transistors, and a diode means (D1) connected between the capacitor and the second transistor.

5 Claims, 1 Drawing Sheet

PORTABLE RADIO TRANSCEIVER

TECHNICAL FIELD

The present invention relates to portable radio transceivers, such as mobile telephones. More particularly, the invention is directed at a portable radio transceiver having a transmitter power amplifier, a series transistor, which is connected to the transmitter power amplifier and is adapted, in response to a transmission control signal, to control transmission by the transmitter power amplifier, and negative bias generating means for providing negative bias to the transmitter power amplifier, where the negative bias generating means is also used for increasing a voltage applied to the gate of the series transistor so as to reduce its resistance.

BACKGROUND ART

The voltage supply used in portable electronic communication devices, such as mobile telephones, gets lower and lower. Output power amplification is provided by a transmitter power, amplifier, which usually comprises GaAs semiconductor components: A negative bias has to be generated and must be applied to the gates of the GaAs components, before positive supply voltage is applied. Otherwise, very high current peaks may arise and, under unfortunate circumstances, damage the semiconductor components.

A series transistor, usually a MOSFET transistor, is connected in series with the supply voltage and the transmitter power amplifier so as to disable and enable transmission by the transmitter power amplifier in response to a transmission control signal on its gate.

The series transistor must have as low internal resistance as possible during transmission, so that an unnecessary voltage drop is not generated between the battery and the transmitter power amplifier. It is well-known that the resistance of a MOSFET transistor decreases with increasing voltage between source and gate, once the conduction threshold has been reached. The battery voltage limits the highest possible voltage, that may be applied between source and gate of the series transistor, unless special means are provided.

EP-A2-0 700 165 discloses a portable radio transceiver having means in the form of a charge pump for generating a negative bias voltage to a GaAs transmitter power amplifier transistor. A positive voltage supply to the transmitter power amplifier is controlled by a series transistor (p-channel MOSFET), which is connected in series between the positive voltage supply from the battery and the transmitter power amplifier. The transmitter power amplifier is disabled and enabled is response to a transmit control signal, which is applied to the gate of the series transistor. Moreover, the charge pump for generating negative bias to the transmitter power amplifier is also used for increasing the voltage applied to the gate of the series transistor, by means of a level shifter, so as to reduce the internal resistance of the series transistor.

The portable radio transceiver shown in EP-A2-0 700 165 is thus capable of reducing the internal resistance of the series transistor, thereby reducing the voltage drop between battery and transmitter power amplifier. However, the solution shown in this patent publication requires complex circuitry for the charge pump and the level shifter.

SUMMARY OF THE INVENTION

It is an object of the present invention to simplify the circuitry required for providing the negative bias supply and the reduction in internal resistance of the series transistor for a portable radio transceiver according to the above.

Another purpose of the present invention is to provide immunity against transmit control signal faults, particularly so that a transmit control signal, which is erroneously maintained at its on-level, will not maintain the transmitter power amplifier in transmit mode during a long period of time.

It is a further object of the present invention to provide improved protection for the semiconductor components of the transmitter power amplifier.

The above objects are achieved by a portable radio transceiver according to the appended independent patent claim.

Other objects, features and advantages of the present invention will appear from the following detailed disclosure, from the drawing as well as from the dependent claims.

BRIEF DESCRIPTION OF THE DRAWINGS

A preferred embodiment of the present invention will now be described in mere detail, reference being made to the accompanying drawing, in which.

DETAILED DISCLOSURE

Figure 1:
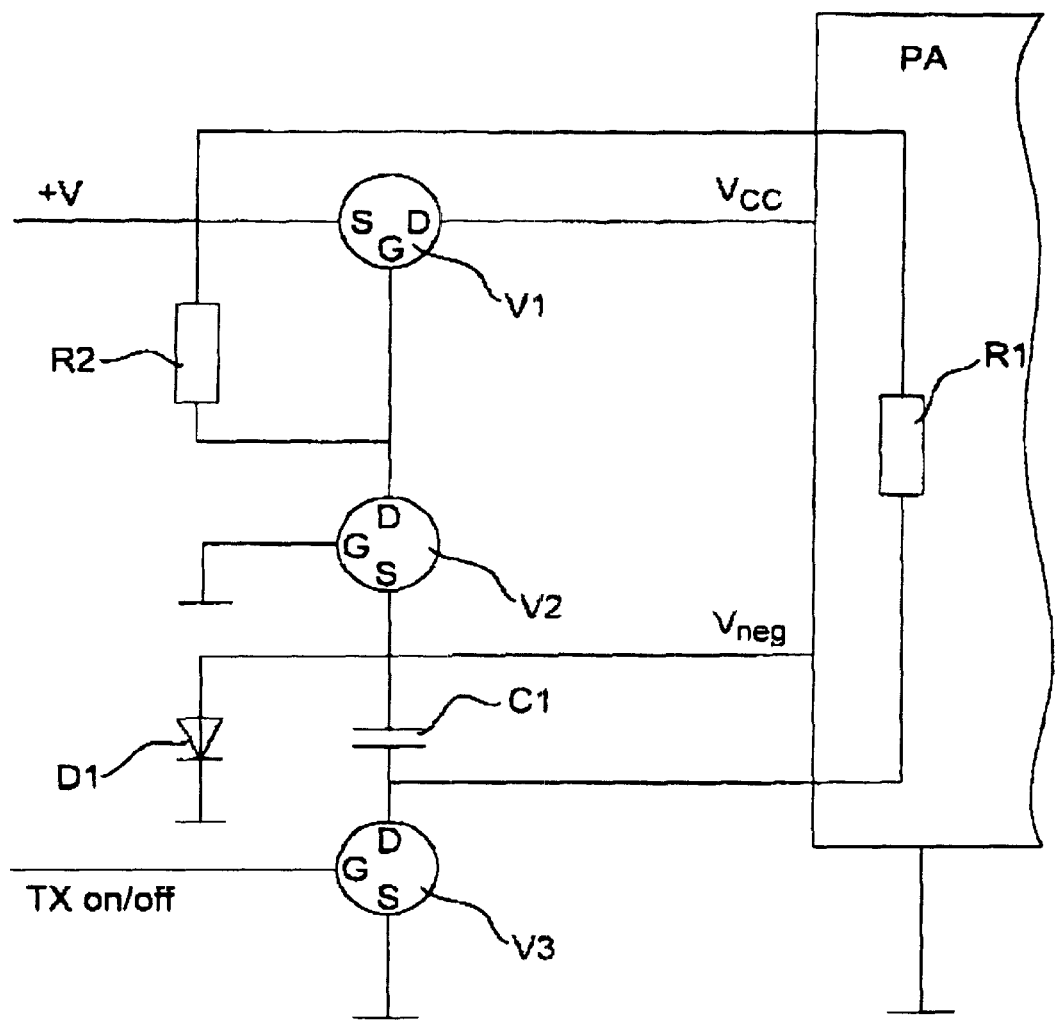
FIG. 1 illustrates a schematic circuit diagram of the preferred embodiment.

FIG. 1 illustrates a preferred embodiment or the invention, which comprises voltage-doubling circuitry with high efficiency for controlling the series transistor to disable and enable the transmitter power amplifier. The voltage doubling circuitry is only active during transmit control pulses, wherein power losses are minimized and smaller semiconductors may be used. Only one common control signal from a controller (not shown in the drawing) of the radio transceiver is used for enabling negative bias voltage supply to at least one GaAs semiconductor component of the transmitter power amplifier: as well as positive voltage supply through the series transistor to the transmitter power amplifier. A further advantage is that no supply voltage will reach the transmitter power amplifier, if the bias voltage is not negative enough. Moreover, if a transmit control signal will erroneously remain in its on condition, it will be automatically interrupted, before any damage has occurred The circuitry of FIG. 1 comprises a p-channel MOSFET transistor V1, which in a well-known way may be brought to a conductive and an isolating state, respectively, depending on a voltage applied between gate and source. Moreover, two n-channel MOSFET transistors V2 and V3 are provided in the circuitry and preferably have their transition voltage between 2 and 3 volt.

Moreover, a Schottky diode D1 is provided and is conductive in one direction only, having a low voltage drop in its conducting direction and an inverse voltage, which exceeds the maximum supply voltage of the circuitry.

In addition, two resistors R1 and R2 are provided, as well as a capacitor C1.

The circuitry shown in FIG. 1 has the following operation, assuming that the transmission control signal TX on/off at V3's gate is 0 volt, when voltage in, initially supplied to the circuitry. Resistor R1 will then charge capacitor C1, wherein the voltage at V3's drain will be equal to the supply voltage +V. The diode D1 will prevent the second terminal of C1, which is connected to the source of the transistor V2, from becoming more positive than a diode voltage. The voltage across C1 will be the supply voltage minus the diode voltage drop. The transistor V2 will be cut off, when the voltage across gate and source does not reach the conducting voltage at about 2.5 volt. The aeries transistor V1 is cut off, since R2 will keep the gate-source voltage at the same potential.

If a voltage exceeding the conducting voltage threshold (>1.5 volt) is applied at V3's gate, V3 will force the source terminal of transistor V2, via the capacitor C1, to the negative value of the supply voltage, which previously were applied across the capacitor. Transistor V2 will begin to conduct, as soon as its source-gate voltage exceeds the conducting voltage threshold at about 2.5 volt, and the negative voltage (relative to ground) reaches the gate terminal of the series transistor V1. The aeries transistor V1 will now be open, until the charge at capacitor C1 has been discharged through V2 by resistor R2 to such an extent, that V2 will again be cut off and consequently also the series transistor V1. Hence, an automatic disabling operation is achieved.

By selecting a MOSFET with a suitable pinch-off, the threshold for controlling the negative voltage and thus the disabling and enabling of the supply voltage may be selected.

If the control voltage at the gate terminal of transistor V3 changes to 0, before capacitor C1 has been fully discharged through V2 by R2, resistor R1 will force the voltage at the source terminal of V2 to rise immediately to the conducting voltage drop of the diode D1. Transistor V2 will block, a soon as the voltage passes the conducting voltage threshold (pinch-off).

Preferably, but not necessarily, the portable radio transceiver described above is a mobile telephone.

What is claimed is:

1. A portable radio transceiver, comprising a transmitter power amplifier (PA), a series transistor (V1), which is connected to the transmitter power amplifier and is adapted, in response to a transmission control signal (TX on/off), to control transmission by the transmitter power amplifier, and negative bias generating means for providing negative bias ($V_{neg}$) to the transmitter power amplifier, wherein the negative bias generating means is also used for increasing a voltage applied to the gate of the series transistor so as to reduce its resistance, characterized in that the negative bias generating means comprises:

a second transistor (V2) connected to the gate of the series transistor (V1), a third transistor (V3), the gate of which is adapted to receive said transmission control signal (TX on/off), a capacitor (C1) connected between the second and third transistors, and a diode means (D1) connected between the capacitor and the second transistor.

2. A portable radio transceiver as in claim 1, wherein the negative bias ($V_{neg}$) is supplied to the transmitter power amplifier (PA) from a nods between the capacitor (C1) and the second transistor (V2).

3. A portable radio transceiver as in claim 1, wherein the series transistor (V1) is a p-channel MOSFET, whereas the second and third transistors (V2, V3) are n-channel MOSFETs.

4. A portable radio transceiver as in claim 1, wherein the transmitter power amplifier (PA) comprises at least one GaAs semiconductor component.

5. A portable radio transceiver as in claim 1, in the form of a mobile telephone.

* * * * *